United States Patent [19]

Thakur et al.

[11] Patent Number: 4,684,434
[45] Date of Patent: Aug. 4, 1987

[54] METHOD FOR THE PREPARATION OF THIN LARGE-AREA SINGLE CRYSTALS OF DIACETYLENES AND POLYDIACETYLENES

[75] Inventors: Mrinal K. Thakur, Summit, N.J.; Sukant K. Tripathy; Daniel J. Sandman, both of Acton, Mass.

[73] Assignee: GTE Laboratories Incorporated, Waltham, Mass.

[21] Appl. No.: 705,587

[22] Filed: Feb. 26, 1985

[51] Int. Cl.$^4$ .................. C30G 1/12; C30G 29/54; C30G 29/58
[52] U.S. Cl. .................. 156/622; 156/624; 156/DIG. 13; 427/35; 427/44
[58] Field of Search ............... 156/DIG. 13, 621, 622, 156/624, 273.7; 562/598, 600; 560/855, 873, 856; 522/3, 173, 174, 180, 179, 182; 427/35, 44; 526/240, 285; 260/456 P

[56] References Cited

U.S. PATENT DOCUMENTS

| 4,215,208 | 7/1980 | Yee et al. | 526/285 |
| 4,220,747 | 9/1980 | Preziosi et al. | 526/285 |
| 4,235,108 | 11/1980 | Patel | 522/174 |
| 4,238,352 | 12/1980 | Patel | 522/174 |
| 4,562,141 | 12/1985 | Tieke | 526/285 |

FOREIGN PATENT DOCUMENTS 105624 8/1981 Japan ................... 156/621

OTHER PUBLICATIONS

Thakur et al., Presentation–Optical Properties of a Hew Phase of Poly TCDV, APS meetings, 3/27/84, Gordon Conference 7/3/84—abstract.
Collan, Cryogenics, 6/69, p. 215.
Blour et al., Chemical Physics Letters, v 24, No. 3, 2/1/74, pp. 407–411.
Rickert et al., Mol. Cryst. Liq. Cryst. 1983, v. 93, pp. 307–314.
Casalnuovo et al. Malcromel. Chem., Rapid Commun-5, pp. 77–81 (1984).
Balik et al., J. Pol. Sci 20, pp. 2003–2016 (1982).
Thakur et al, Growth of Large Area Thin Film Single Crystals of Poly(diacetylenes), Macromolecules, vol. 18, pp. 2341–2344, Nov. 1985.

Primary Examiner—Gary P. Straub
Attorney, Agent, or Firm—Martha A. Finnegan; Frances P. Craig

[57] ABSTRACT

A method for preparing thin large-area single crystals of diacetylene monomer represented by the formula:

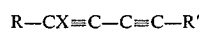

$$R-CX\equiv C-C\equiv C-R'$$

wherein R and R' are side groups selected such that the diacetylene monomer is polymerizable by a 1,4-addition solid state reaction upon exposure to actinic radiation, is provided. The method involves forming a liquid layer containing pure diacetylene monomer between two opposed surfaces; applying pressure to the liquid layer disposed between the two opposed surfaces; and crystallizing the liquid layer disposed between the two opposed surfaces while the liquid layer is kept under constant pressure to form thin large-area single crystals of pure diacetylene monomer.

A method for preparing thin large-area single crystals of polydiacetylene is also provided. The method involves forming a liquid layer containing diacetylene monomer represented by the formula:

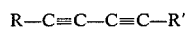

$$R-C\equiv C-C\equiv C-R'$$

wherein R and R' are side groups selected such that the diacetylene monomer is polymerizable by a 1,4-addition solid state reaction upon exposure to actinic radiation in pure form between two opposed surfaces; applying pressure to the liquid layer disposed between the two opposed surfaces; crystallizing the liquid layer disposed between the two opposed surfaces while the liquid layer is kept under constant pressure to form thin large-area single crystals of pure diacetylene monomer; and exposing a surface of the thin large-area single crystal of diacetylene monomer to ultraviolet or gamma radiation to form thin large-area single crystals of polydiacetylene.

12 Claims, No Drawings

METHOD FOR THE PREPARATION OF THIN LARGE-AREA SINGLE CRYSTALS OF DIACETYLENES AND POLYDIACETYLENES

CROSS REFERENCE TO RELATED APPLICATION

U.S. patent application Ser. No. (705,586) by Thakur, Tripathy, and Sandman filed on even date herewith for Thin Large-Area Single Crystals of Diacetylenes and Polydiacetylenes and Methods for the Preparation Thereof.

BACKGROUND OF THE INVENTION

This invention relates to diacetylenes and polymers thereof. More particularly, it relates to the preparation of thin large-area single crystal films of diacetylene and of polymers thereof.

Polydiacetylenes consist of weakly coupled linear parallel chains of conjugated covalently bound carbon atoms. Polydiacetylenes are formed by a solid state reaction of adjacent monomer units in diacetylene single crystals which can be grown by a variety of approaches to achieve macroscopic form. The polymer backbone is usually represented by the acetylenic structure (I)

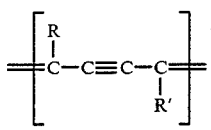
(I)

where R and R' are suitably chosen side groups which vary from polymer to polymer. The fully conjugated backbone of the polydiacetylene provides a one-dimensional electronic structure.

Fully crystalline polydiacetylenes have been reported to exhibit carrier mobilities comparable to silicon or gallium arsenide. For example, the diacetylene polymer from bis (p-toluene-sulfonate) of 2,4-hexadiyne-1,6-diol (PTS) has been reported to exhibit exceptionally high carrier mobilities along its chain direction, $\mu \sim 20\ m^2 s^{-1} v^{-1}$. The long carrier mean free paths implied clearly follow from the full order of these polymers. This class of polymers is of value as nonlinear optical elements, as photoconductors, time-temperature indicators, photoresists, and memories. Polydiacetylenes may also have application in all optical signal processing due to the very high values of their third-order nonlinear susceptibilities $\chi^3(\omega)$.

The predominant physical form required for the various optical, electrical, or electronic applications for polydiacetylenes is that of a uniformly thin ($\leq 100$ microns) large area ($\geq 0.1$ mm on all sides) single crystal. Prior to the present invention that method disclosed in U.S. patent application Ser. No. (705,586) by M. K. Thakur, S. K. Tripathy, and D. J. Sandman entitled "Thin Large-Area Single Crystals of Diacetylenes and Polydiacetylenes and Methods for the Preparation Thereof", filed concurrently herewith, neither polydiacetylene crystals having such dimensions nor a systematic technique for preparing polydiacetylene crystals having such dimensions have been reported.

Conventional approaches of crystallization, as reported in U.S. Pat. No. 4,220,747, issued to A. F. Preziosi et al. on 2 Sept. 1980, result in crystals of uncontrollable dimensions, beset with macroscopic flaws and surface defects. Accordingly, the crystals prepared by known methods are not suitable for most existing and envisaged optical, electrical, or electronic applications. Crystal growth techniques for preparing single crystals of various inorganic materials or small organic molecules have not been successfully used to grow uniformly thin ($\leq 100$ microns) optical quality large size crystals of organic polymers. Epitaxial methods, or the methods for lattice matching, originally developed for crystallization of inorganic solids, has also been tried for organic polymeric materials such as polyethylene, polyoxymethylene, and polydiacetylenes. These efforts have not, however, been successful to prepare uniformly thin ($\leq 100$ microns) macroscopic single crystals of polydiacetylene. Polydiacetylene crystals grown by epitaxial methods, as reported by S. E. Rickert et al. in Mol. Cryst. and Liq. Cryst. 96, 307 (1983), are only of microscopic size, $\sim 1$ micron$\times 1$ micron$\times 200$ angstroms.

SUMMARY OF THE INVENTION

In accordance with the present invention, there is provided a method for preparing thin large-area single crystals of diacetylene monomer comprising: forming a liquid layer containing pure diacetylene monomer represented by the formula

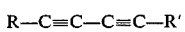

wherein R and R' are side groups selected such that the diacetylene monomer is polymerizable by a 1,4-addition solid state reaction upon exposure to actinic radiation between two opposed surfaces; applying pressure to the liquid layer disposed between the two opposed surfaces; and crystallizing the liquid layer disposed between the two opposed surfaces, while the liquid layer is kept under constant pressure, to form a thin large-area single crystal of diacetylene monomer.

More specifically, the method for preparing thin large-area crystals of diacetylenes comprises: forming a liquid layer containing the selected pure diacetylene monomer between two opposed surfaces either by melting crystals of pure diacetylene monomer between the two opposed surfaces or by placing a solution layer consisting of pure diacetylene monomer dissolved in a pure solvent between the two opposed surfaces; applying pressure greater than or equal to about 0.5 psi (0.04 kg.cm$^{-2}$) to the liquid layer disposed between the two opposed surfaces; and crystallizing the liquid layer disposed between the two opposed surfaces while the liquid layer is kept under constant pressure by either cooling the molten diacetylene monomer layer at a cooling rate less than or equal to about 0.1° C./minute or by slowly evaporating the solvent from the solution layer at a constant temperature to form a thin large-area single crystal of diacetylene monomer.

In accordance with another aspect of the present invention, there is provided a method for preparing thin large-area single crystals of polydiacetylene comprising: forming a liquid layer containing pure diacetylene monomer represented by the formula

wherein R and R' are selected such that the diacetylene monomer is polymerizable by a 1,4-addition solid state reaction upon exposure to actinic radiation between two opposed surfaces; applying pressure greater than or equal to about 0.5 psi (0.04 kg.cm$^{-2}$) to the liquid layer disposed between the two opposed surfaces; crystallizing the liquid layer disposed between the two opposed surfaces while the liquid layer is kept under constant pressure to form a thin large-area single crystal of diacetylene monomer; and exposing the thin large-area single crystal of diacetylene monomer to actinic radiation, e.g., ultraviolet or gamma radiation, to form a thin large-area single crystal of polydiacetylene.

The diacetylene monomer and polydiacetylene crystals prepared by the method of the present invention possess optical quality, i.e., the crystals are suitable for optical applications. These crystals are essentially free of flaws and surface defects.

A "thin large-area single crystal" of diacetylene monomer or polydiacetylene prepared in accordance with the methods of the present invention has two flat planar opposed major parallel faces with surface dimensions greater than or equal to about 0.1 mm on all sides and a uniform thickness less than or equal to about 100 microns.

DETAILED DESCRIPTION OF THE INVENTION

In accordance with the present invention, there is provided a method for preparing uniformly thin large-area single crystals of diacetylene monomer represented by the general formula

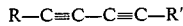

wherein R and R' are side groups selected such that the diacetylene monomer is polymerizable by a 1,4-addition solid state reaction upon exposure to actinic radiation. In order for a diacetylene monomer to be polymerizable by solid state polymerization of the monomer, the diacetylene monomer must exhibit suitable molecular packing parameters. More specifically, in order for the diacetylene monomer to be solid-state polymerizable, neighboring monomer molecules should be separated by a stacking distance, or center-to-center vector, which is in the range of 3.8 to 8.3 Angstroms, and preferably in the range 4.4 to 6.8 Angstroms. Additionally, the inclination of the rods of the diacetylene groups in these neighboring molecules with respect to the stacking axis, or vector, must be in the range 24° to 65°, and preferably in the range of 30° to 51°. Maximal reactivity is expected for a stacking distance or vector, of about 5 Angstroms and an angle of about 45°. Solid-state reactivity is controlled by the monomer packing, rather than by the chemical nature of the R and R' substituents of the monomer molecule. See V. Enkelmann, "Structural Aspects of the Topochemical Polymerization of Diacetylenes", Advances in Polymer Science: Polydiacetylenes, Springer-Verlag, Berlin Heidelberg 1984, pp 91-136; and U.S. Pat. No. 4,220,747 issued to Preziosi et al. on Sept. 1, 1980 for "Crystalline Diacetylene Polymers", which are incorporated herein by reference.

Examples of suitably chosen R—R' pairs include:

R=—CH$_2$OSO$_2$C$_6$H$_4$CH$_3$ and R'=—CH$_2$OSO$_2$C$_6$H$_4$CH$_3$;

R=—CH$_2$OCONHC$_6$H$_5$ and R'=CH$_2$OCONHC$_6$H$_5$;

R=—(CH$_2$)$_3$OCONHC$_6$H$_5$ and R'=—(CH$_2$)$_3$OCONHC$_6$H$_5$;

R=—(CH$_2$)$_4$OCONHC$_6$H$_5$ and R'=—(CH$_2$)$_4$OCONHC$_6$H$_5$;

R=—(CH$_2$)$_4$OCONHC$_2$H$_5$ and R'=(CH$_2$)$_4$OCONHC$_2$H$_5$;

R=—(CH$_2$)$_4$OCONHCH(CH$_3$)$_2$ and R'=—(CH$_2$)$_4$OCONHCH(CH$_3$)$_2$;

R=—(CH$_2$)$_n$OCONHCH$_2$COOZ and R'=—(CH$_2$)$_n$OCONHCH$_2$COOZ, wherein Z is an alkyl or aryl group;

R=—CH$_2$NC$_{12}$H$_8$ and R'=—CH$_2$NC$_{12}$H$_8$;

R=—(CH$_2$)$_2$OH and R'=—(CH$_2$)$_2$OH;

R=—(CH$_2$)$_3$OH and R'=—(CH$_2$)$_3$OH;

R=—(CH$_2$)$_8$COOCH$_3$ and R'=—(CH$_2$)$_8$COOCH$_3$;

R=—CH$_2$OH and R'=CH$_3$;

R=—(CH$_2$)$_n$CH$_3$ and R'=—(CH$_2$)$_m$COOH, wherein $12<n<16$, $1<m<10$, and n and m are different integers; and R=—(CH$_2$)$_n$CH$_3$ and R'=—(CH$_2$)$_m$COO$^-$Li$^+$, wherein $12<n<16$, $1<m<10$, and n and m are different integers.

As used herein, "thin large-area single crystal" is used to mean a single crystal having two flat planar opposed major parallel faces with surface dimensions greater than or equal to about 0.1 mm on all sides and uniform thicknesses less than or equal to about 100 microns.

The method of the present invention for preparing uniformly thin large-area single crystals of a suitably substituted diacetylene monomer comprises: forming a liquid layer containing a pure diacetylene monomer between two opposed surfaces; applying pressure of at least 0.5 psi (0.04 kg.cm$^{-2}$) to the liquid layer disposed between the two opposed surfaces; and slowly crystallizing the liquid layer between the two opposed surfaces while the liquid layer is kept under constant pressure to form a thin large-area single crystal of pure diacetylene monomer. The method of the present invention is conducted in an inert atmosphere.

For example, thin large-area single crystals of diacetylenes can be prepared by forming a liquid layer containing the selected pure diacetylene monomer between two opposed surfaces either by melting crystals of a selected pure diacetylene monomer between the two opposed surfaces to form a molten diacetylene monomer layer or by placing a solution layer consisting of pure diacetylene monomer dissolved in a pure solvent between the two opposed surfaces to form a solution layer. Pressure greater than or equal to about 0.5 psi (0.04 kg. cm$^{-2}$) is applied to the liquid layer disposed between the two opposed surfaces, and the liquid layer disposed between the two opposed surfaces is crystallized while the liquid layer is kept under constant pressure by either cooling the molten diacetylene monomer layer at a rate less than or equal to about 0.1° C./minute or by slowly evaporating the solvent from the solution layer at a constant temperature.

The crystals prepared in accordance with the present invention are essentially free of flaws and surface defects, and consequently, can be described as possessing optical quality.

In order for diacetylene monomer materials to be suitable for preparing uniformly thin large area single crystals possessing optical quality, diacetylene monomer materials must be free of any polymerized particles and other impurities. Diacetylene monomers tend to polymerize partially even by exposure to ordinary light at room temperature. Diacetylene monomers should be stored preferably in solution at low temperatures in the dark. Best results are obtained if freshly prepared monomer materials, purified and crystallized following conventional approaches, are used; and if the present method is carried out in a clean room (class 100) condition under red light. The diacetylene monomer starting material should be selected to have the R and R' side groups of the desired product.

The two opposed surfaces between which the thin large-area single crystals are prepared must be flat, smooth, parallel surfaces.

Scrupulous cleanliness of the two opposed surfaces between which the liquid layer is disposed must be maintained throughout the preparation process to avoid undesired nucleation during the growth process. Examples of surfaces suitable for use in preparing the crystals of the present invention are glasses, quartz, inorganic salt crystals, and metals. The two substrates being used to form the two opposed surfaces need not be of similar materials. For example, glass-salt, glass-metal, and salt-metal substrate pairs function equally as well as glass-glass, quartz-quartz, salt-salt, and metal-metal substrate pairs.

In the melt variation of the present method, the liquid layer containing the selected pure diacetylene monomer is formed between the two opposed surfaces by melting crystals of pure diacetylene monomer between two opposed surfaces. The melting is accomplished, for example, by placing the desired pure diacetylene monomer crystals between two substrates, which substrates are arranged with respect to each other so as to form two opposed surface, and heating the entire substrate/monomer/substrate assembly to a temperature slightly above the monomer melting point to completely melt the monomer crystals, thereby forming a liquid layer between the two opposed surfaces.

The liquification of the diacetylene by melting is carried out in an inert atmosphere, which atmosphere is maintained during the application of pressure and during the crystallization of the molten layer while the molten liquid layer is kept under constant pressure.

The amount of pressure applied to the molten layer and maintained during the crystallization thereof should be greater than or equal to about 0.5 psi (0.04 kg.cm$^{-2}$). Preferably, the amount of pressure applied to the molten layer throughout the procedure is greater than or equal to about 5 psi (0.4 kg.cm$^{-2}$).

The molten layer is crystallized by slowly reducing the temperature, at a cooling rate of less than or equal to about 0.1° C./minute, while maintaining constant pressure. For best results, the temperature is reduced at a cooling rate less than or equal to about 0.5° C./hour.

In the solution variation of the present method, the liquid layer containing pure diacetylene monomer is formed between the two opposed surfaces by placing a solution containing a selected pure diacetylene monomer dissolved in pure solvent between two substrates, which substrates are arranged with respect to each other so as to form two opposed surfaces. The concentration of the diacetylene monomer in the solvent is less than or equal to the saturation limit of the monomer in the solvent for the ambient temperature and pressure. In other words, when the solution layer is placed between the two opposed surfaces, the solution layer must not contain any undissolved monomer, i.e., all of the monomer must be dissolved in the solvent. Preferably the concentration of the monomer in the solvent is greater than or equal to approximately 1 mg/ml, but less than or equal to the saturation limit of the monomer in the solvent for the conditions existing when the liquid layer is formed.

Throughout the procedure, the substrate/solution/substrate assembly is maintained in an inert atmosphere, which is preferably saturated with vapor of the particular solvent in which the monomer is dissolved.

A constant pressure is applied to the solution layer disposed between the two opposed surfaces of the assembly and the pressure is maintained while the solvent is slowly evaporated at a constant temperature. For example, the substrate/solution/substrate assembly having the solution layer under constant pressure can be placed in a dessicator under an inert atmosphere at a temperature less than or equal to room temperature. The evaporation can then be controlled by passing an inert carrier gas through the dessicator. The rate of evaporation can be made even slower by lowering the temperature at which evaporation is carried out. For example, slow evaporation occurs at 0° C.

In the solution variation of the present method, the pressure applied to the diacetylene monomer containing liquid layer and maintained during crystallization of the liquid layer should be greater than or equal to approximately 0.5 psi (0.04 kg.cm$^{-2}$).

The thickness of the crystals prepared by the present invention is a function of the pressure applied to the liquid layer throughout the process and of the proximity of the two opposed surfaces. The thickness of the crystals can be reduced by using higher pressures or by bringing the two opposed surfaces closer together.

The method of the present invention for preparing uniformly thin large-area single crystals of polydiacetylene monomer comprises: forming a liquid layer containing a pure diacetylene monomer selected in accordance with the above, between two opposed surfaces; applying pressure of at least 0.5 psi (0.04 kg.cm$^{-2}$) to the liquid layer disposed between the two opposed surfaces; slowly crystallizing the liquid layer between the two opposed surfaces while the liquid layer is kept under constant pressure to form a thin large-area single crystal of pure diacetylene monomer; and exposing the thin large-area single crystal of diacetylene monomer to ultraviolet or gamma radiation to form a thin large-area single crystal of polydiacetylene. The method of the present invention is conducted in an inert atmosphere.

For example, thin large-area single crystals of polydiacetylenes can be prepared by forming a liquid layer containing the selected pure diacetylene monomer between two opposed surfaces either by melting crystals of a selected pure diacetylene monomer between the two opposed surfaces to form a molten diacetylene monomer layer or by placing a solution layer. Pressure greater than or equal to about 0.5 psi (0.04 kg. cm$^{-2}$) is applied to the liquid layer disposed between the two opposed surfaces, and the liquid layer disposed between the two opposed surfaces is crystallized while the liquid layer is kept under constant pressure by either cooling the molten diacetylene monomer layer at a rate less than or equal to about 0.1° C./minute or by slowly evaporating the solvent from the solution layer at a constant temperature. The resulting thin large-area single crystal of diacetylene monomer is then exposed to ultraviolet or gamma radiation to produce a thin large-area single crystal of polydiacetylene.

The crystals prepared in accordance with the present invention are essentially free of flaws and surface defects, and consequently, can be described as possessing optical quality.

In order for diacetylene monomer materials to be suitable for use in preparing uniformly thin large area single crystals of polydiacetylene which possess optical quality, the diacetylene monomer materials must be free of any polymerized particles and other impurities. Because diacetylene monomers tend to partially polymerize by exposure to ordinary light at room temperature, diacetylene monomers should be stored preferably in solution at low temperatures in the dark. Best results are obtained if freshly prepared monomer materials, purified and crystallized following conventional approaches, are used; and if the present method is carried out in a clean room (class 100) condition under red light. The diacetylene monomer starting material should be selected to have the R and R' side groups of the desired product.

The two opposed surfaces between which the thin large-area single crystals are prepared must be flat, smooth, parallel surfaces.

Scrupulous cleanliness of the two opposed surfaces between which the liquid layer is disposed must be maintained throughout the preparation process to avoid undesired nucleation during the growth process. Examples of surfaces suitable for use in preparing the crystals of the present invention are glasses, quartz, inorganic salt crystals, and metals. The two substrates being used to form the two opposed surfaces need not be of similar materials. For example, glass-salt, glass-metal, and salt-metal substrate pairs function equally as well as glass-glass, quartz-quartz, salt-salt, and metal-metal substrate pairs.

In the melt variation of the present method, the liquid layer containing the selected pure diacetylene monomer is formed between the two opposed surfaces by melting crystals of pure diacetylene monomer between two opposed surfaces. The melting is accomplished, for example, by placing the desired pure diacetylene monomer crystals between two substrates, which substrates are arranged with respect to each other so as to form two opposed surface, and heating the entire substrate/monomer/substrate assembly to a temperature slightly above the monomer melting point to completely melt the monomer crystals, thereby forming a liquid layer between the two opposed surfaces.

The liquification of the diacetylene by melting is carried out in an inert atmosphere, which atmosphere is maintained during the application of pressure and during the crystallization of the molten layer while the molten liquid layer is kept under constant pressure.

The amount of pressure applied to the molten layer and maintained during the crystallization thereof should be greater than or equal to about 0.5 psi (0.04 kg.cm$^{-2}$). Preferably, the amount of pressure applied to the molten layer throughout the procedure is greater than or equal to about 5 psi (0.4 kg.cm$^{-2}$).

The molten layer is crystallized by slowly reducing the temperature, at a cooling rate of less than or equal to about 0.1° C./minute, while maintaining constant pressure. For best results, the temperature is reduced at a cooling rate less than or equal to about 0.5° C./hour. After slow crystallization of the molten layer is completed, a planar surface of the resulting thin large-area single crystal of diacetylene monomer is exposed to ultraviolet or gamma radiation to solid state polymerize the diacetylene and produce a thin large-area single crystal of polydiacetylene.

In the solution variation of the present method, the liquid layer containing pure diacetylene monomer is formed between the two opposed surfaces by placing a solution containing a selected pure diacetylene monomer dissolved in pure solvent between two substrates, which substrates are arranged with respect to each other so as to form two opposed surfaces. The concentration of the monomer in the solvent is less than or equal to the saturation limit of the monomer in the solvent for the ambient temperature and pressure. In other words, when the solution layer is placed between the two opposed surfaces, the solution layer must not contain any undissolved monomer, i.e., all of the monomer must be dissolved in the solvent. Preferably the concentration of the monomer in the solvent is greater than or equal to approximately 1 mg/ml, but less than or equal to the saturation limit of the monomer in the solvent for the ambient conditions.

Throughout the procedure, the substrate/solution/substrate assembly is maintained in an inert atmosphere, which is preferably saturated with vapor of the particular solvent in which the monomer is dissolved.

A constant pressure is applied to the solution layer disposed between the two opposed surfaces of the assembly and the pressure is maintained while the solvent is slowly evaporated at a constant temperature. For example, the substrate/solution/substrate assembly having the solution layer under constant pressure can be placed in a dessicator under an inert atmosphere at a temperature less than or equal to room temperature. The evaporation can then be controlled by passing an inert carrier gas through the dessicator. The rate of evaporation can be made even slower by lowering the temperature at which evaporation is carried out. For example slow evaporation occurs at 0° C. The resulting thin large-area single crystal of diacetylene monomer is then exposed to ultraviolet or gamma radiation to form a thin large-area single crystal of polydiacetylene.

In the solution variation of the present method, the pressure applied to the diacetylene monomer containing liquid layer and maintained during crystallization of the liquid layer should be greater than or equal to approximately 0.5 psi (0.04 kg.cm$^{-2}$).

The thickness of the crystals prepared by the present invention is a function of the pressure applied to the liquid layer throughout the process and/or of the proximity of the two opposed surfaces. The thickness of the crystals can be reduced by using higher pressures and/or by bringing the two opposed surfaces closer together. The solid state polymerization of diacetylene monomer in the form of uniformly thin large-area single crystals produces uniformly thin large area single crystals of the respective polydiacetylene of approximately the same size.

The growth technique of the present invention may be further illustrated with reference to the following examples:

EXAMPLE I

A diacetylene with R=R'=—(CH$_2$)$_4$OCONHC$_6$H$_5$ (TCDU) was crystallized from ethylacetate/acetone solution. Some of these crystals were incorporated in the interface to two precleaned glass slides. The cleaning of the glass slides was performed using soap-water, concentrated sulfuric acid, and distilled (deionized) water in sequence. The glass/monomer/glass assembly was heated by a well regulated hot stage to 150° C. under a pressure of about 5 psi. The monomer melted and spread into a thin liquid film. Finally, the crystallization was effected by slow cooling of the system at a rate of 0.1° C./minute under constant pressure. The resulting crystal film was studied using a optical microscope (Leitz 12 pol) under polarization conditions. Solid state polymerization was achieved by exposing a surface of the monomer crystal to untraviolet radiation. Fully oriented regions of area 0.2 cm×0.2 cm and a thickness of approximately 10 microns were observed.

EXAMPLE II

Monomer crystals of TCDU, crystallized from solution, were introduced in the interface of glass/KCL substrates. Freshly cleaved clean surface of the 010 face of KCl was used. Using the hot stage the glass/monomer/KCl assembly was heated to 150° C. under a pressure of about 5 psi. Crystallization was achieved again by slow cooling at a rate of 0.1° C./min. under constant pressure. The resulting crystal film on the KCl substrates was polymerized by exposing the monomer crystal to ultraviolet radiation. The resulting crystal film of poly-TCDU was oriented over an area of approximately 0.3 cm×0.4 cm and had a thickness of approximately 10 microns.

EXAMPLE III

Using the same procedure set forth in Example II, above, thin film monomer crystal was grown in the interface of glass and SrF$_2$ substrates and polymerized by exposure to ultraviolet radiation. The poly-TCDU crystal thus obtained was oriented over an area of 0.5 cm×0.5 cm at the 110 face of SrF$_2$ substrates and had a thickness of approximately 10 microns. Further investigation indicated that lattice matching occurred in this process.

EXAMPLE IV

A diacetylene monomer with R=R'=—CH$_2$OSO$_2$C$_6$H$_4$CH$_3$ (PTS) was dissolved in acetone to a dilution of 1 mg/ml. A glass beaker (10 ml) with perfectly flat bottom was filled to half with this solution. A round crystal of CaF$_2$ with a diameter exactly fitting with the bottom surface area of the glass beaker was subsequently introduced inside the beaker. Thus an assembly of glass/solution/CaF$_2$ was formed which was subsequently subjected to a pressure of 0.5 psi. Finally, the entire assembly, under pressure, was placed in a dessicator at room temperature under an inert atmosphere saturated with acetone vapor, and the evaporation of the solvent was controlled by passing argon as the carrier gas.

The PTS crystals thus obtained on the 100 face of the CaF$_2$ substrate were approximately 0.4 cm×0.4 cm in area and had a thickness of approximately 12 microns. Solid State polymerization was achieved by exposing the PTS crystal to ultraviolet radiation.

EXAMPLE V

Monomer solution for TCDU was processed following the procedure outlined in Example IV and polymerization was accomplished by exposing the monomer crystal film to ultraviolet radiation. The resulting single crystal poly-TCDU films on the 100 face of CaF$_2$ were approximately 0.3 cm×0.6 cm in area and approximately 15 microns in thickness.

EXAMPLE VI

Both PTS and TCDU monomer solutions were processed following the procedure outlined in Example IV with SrF$_2$ as the substrate in place of CaF$_2$. In this case also, large-area (0.3 cm×0.5 cm) single polymer crystals with thicknesses of approximately 12 microns were obtained.

EXAMPLE VII

A concentrated solution of the PTS monomer in acetone (concentration=0.2 g/ml) was incorporated between precleaned quartz slides with polished surfaces. The quartz/solution/quartz assembly was placed between two controlled temperature (sensitivity 0.1° C.) plates which were mounted on a press (Carver Laboratory Press, Model B) in an argon atmosphere. A constant pressure of approximately 5 psi was applied. Slow evaporation of the solvent at a temperature of about 2° C. over many hours (about 80 hours) resulted in thin (approximately 1 micron) large area (approximately 3 mm×2 mm) crystals of the monomer. The area was measured using an optical microscope (Leitz, Laborlux 12 Pol) and the thickness by a Dektak (Technology Corp., Santa Barbara). Solid state polymerization was achieved by exposing a surface of the monomer crystal to ultraviolet radiation. Optically flat mirror like surfaces of the polymer crystals were observed under cross polarized beam conditions.

EXAMPLE VIII

A solution of the PTS monomer in acetone (concentration=5 mg/ml) was incorporated between precleaned quartz slides with polished surfaces. The quartz/solution/quartz assembly was placed between two controlled temperature (sensitivity 0.1° C.) plates which were mounted on a press (Carver Laboratory Press, Model B) in an argon atmosphere. A constant pressure of approximately 5 psi was applied. Slow evaporation of the solvent at a temperature of about 2° C. over many hours (about 80 hours) resulted in thin (approximately 1 micron) large area (approximately 3 mm×2 mm) crystals of the monomer. The area was measured using an optical microscope (Leitz, Laborlux 12 Pol) and the thickness by a Dektak (Technology Corp., Santa Barbara). Solid state polymerization was achieved by exposing a surface of the monomer crystal to ultraviolet radiation. Optically flat mirror like surfaces of the polymer crystals were observed under cross polarized beam conditions.

While it has been shown and described what are considered preferred embodiments of the present invention, it will be obvious to those skilled in the art that various changes and modifications may be made therein without departing from the invention as defined by the appended claims.

What is claimed is:

1. A method for preparing thin large-area single crystals of a diacetylene monomer comprising:

forming a liquid layer containing molten pure diacetylene monomer represented by the formula

wherein R and R' are side groups selected such that the diacetylene monomer is polymerizable by a 1,4-addition solid state reaction upon exposure to actinic radiation between two clean, parallel, flat, smooth, opposed surfaces;

applying pressure of at least 0.5 psi to the liquid layer disposed between the two opposed surfaces; and crystallizing the liquid layer disposed between the two opposed surfaces, while the liquid layer is kept under constant pressure of at least 0.5 psi, to form a thin large-area single crystal of diacetylene monomer;

wherein the steps of forming, applying pressure to, and crystallizing the liquid layer are all carried out in an inert atmosphere.

2. A method in accordance with claim 1 wherein R and R' are selected from the group of R and R' pairs consisting of R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'—(CH$_2$)$_4$OCONHC$_6$H$_5$;
R=—(CH$_2$)$_4$OCONHC$_2$H$_5$ and R'—(CH$_2$)$_4$OCONHC$_2$H$_5$;
R=—(CH$_2$)$_4$OCONHCH(CH$_3$)$_2$ and R'=—(CH$_2$)$_4$OCONHCH(CH$_3$)$_2$;
R=—(CH$_2$)$_n$OCONHCH$_2$COOZ and R'=—(CH$_2$)$_n$OCONHCH$_2$COOZ, wherein Z is an alkyl or aryl group;
R=—CH$_2$NC$_{12}$H$_8$ and R'=—CH$_2$NC$_{12}$H$_8$;
R=—(CH$_2$)$_2$OH and R'=—(CH$_2$)$_2$OH;
R=—(CH$_2$)$_3$OH and R'=—(CH$_2$)$_3$OH;
R=—(CH$_2$)$_8$COOCH$_3$ and R'=—(CH$_2$)$_8$COOCH$_3$;
R=—CH$_2$OH and R'=—CH$_3$;
R=—(CH$_2$)$_n$CH$_3$ and R'=—(CH$_2$)$_m$COOH, wherein $12<n<16$, $1<m<10$, and n and m are different integers; and
R=—(CH$_2$)$_n$CH$_3$ and R'=—(CH$_2$)$_m$COO$^-$Li$^+$, wherein $12<n<16$, $1<m<10$, and n and m are different integers.

3. A method for preparing thin large-area single crystals of diacetylene monomer comprising:

forming a liquid layer containing pure diacetylene monomer represented by the formula

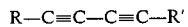

wherein R and R' are selected from the group R and R' pairs consisting of

R=—CH$_2$OSO$_2$C$_6$H$_4$CH$_3$ and R'=—CH$_2$OSO$_2$C$_6$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'=—(CH$_2$)$_4$OCONHC$_6$H$_5$;
R=—(CH$_2$)$_4$OCONHC$_2$H$_5$ and R'=—(CH$_2$)$_4$OCONHC$_2$H$_5$;
R=—(CH$_2$)$_4$OCONHCH(CH$_3$)$_2$ and R'—(CH$_2$)$_4$OCONHCH(CH$_3$)$_2$;
R=—(CH$_2$)$_n$OCONHCH$_2$COOZ and R'=—(CH$_2$)$_n$OCONHCH$_2$COOZ, wherein Z is an alkyl or aryl group;
R=—CH$_2$NC$_{12}$H$_8$ and R'=—CH$_2$NC$_{12}$H$_8$;
R=—(CH$_2$)$_2$OH and R'=—(CH$_2$)$_2$OH;
R=—(CH$_2$)$_3$OH and R'=—(CH$_2$)$_3$OH;
R=—(CH$_2$)$_8$COOCH$_3$ and R'=—(CH$_2$)$_8$COOCH$_3$;
R=—CH$_2$OH and R'=—CH$_3$;
R=—(CH$_2$)$_n$CH$_3$ and R'=—(CH$_2$)$_m$COOH, wherein $12<n<16$, $1<m<10$, and n and m are different integers; and
R=—(CH$_2$)$_n$CH$_3$ and R'=—(CH$_2$)$_m$COO$^-$Li$^+$, wherein $12<n<16$, $1<m<10$, and n and m are different integers;

between two clean, parallel, flat, smooth, opposed surfaces by melting the pure diacetylene monomer between the two opposed surfaces to form a molten diacetylene monomer layer between the two opposed surfaces;

applying pressure greater than or equal to approximately 0.5 psi to the liquid layer disposed between the two opposed surfaces; and crystallizing the liquid layer disposed between the two opposed surfaces, while the liquid layer is kept under constant pressure of at least 0.5 psi, by cooling the molten diacetylene monomer layer at a rate less than or equal to about 0.1° C./minute to form a thin large-area single crystal diacetylene monomer;

wherein the step of forming, applying pressure to, and crystallizing the liquid layer are all carried out in an inert atmosphere.

4. A method for preparing thin large-area single crystals of diacetylene monomer comprising:

forming a liquid layer containing pure diacetylene monomer represented by the formula

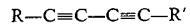

wherein R and R' are side groups selected such that the diacetylene monomer is polymerizable by a 1,4-addition solid state reaction upon exposure to actinic radiation between two clean, parallel, flat, smooth, opposed surfaces by melting thepure diacetylene monomer between the two opposed surfaces to form a molten diacetylene monomer layer;

applying pressure greater than or equal to about 0.5 psi to the liquid layer disposed between the two opposed surfaces; and crystallizing the liquid layer disposed between the two opposed surfaces, while the liquid layer is kept under constant pressure of at least 0.5 psi, by cooling the molten diacetylene monomer layer at a cooling rate less than or equal to about 0.1° C./minute to form a thin large-area single crystal of diacetylene monomer;

wherein the step of forming, applying pressure to, and crystallizing the liquid layer are all carried out in an inert atmosphere.

5. A method for preparing thin large-area single crystals of diacetylene monomer in accordance with claim 4 wherein R and R' are selected from the group of R and R' pairs consisting of:

R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'=—(CH$_2$)$_4$OCONHC$_6$H$_5$;
R=—(CH$_2$)$_4$OCONHC$_2$H$_5$ and R'=—(CH$_2$)$_4$OCONHC$_2$H$_5$;
R=—(CH$_2$)$_4$OCONHCH(CH$_3$)$_2$ R'=—(CH$_2$)$_4$OCONHCH(CH$_3$)$_2$;
R=—(CH$_2$)$_n$OCONHCH$_2$COOZ and R'=—(CH$_2$)$_n$OCONHCH$_2$COOZ, wherein Z is an alkyl or aryl group;
R=—CH$_2$NC$_{12}$H$_8$ and R'=—CH$_2$NC$_{12}$H$_8$;

R=—(CH$_2$)$_2$OH and R'=—(CH$_2$)$_2$OH;
R=—(CH$_2$)$_3$OH and R'=—(CH$_2$)$_3$OH;
R=—(CH$_8$)COOCH$_3$ and R'=—(CH$_2$)$_8$COOCH$_3$;
R=—CH$_2$OH and R'=—CH$_3$;
R=—(CH$_2$)$_n$CH$_3$ and R'=—(CH$_2$)$_m$COOH, wherein 12<n<16, 1<m<10, and n and m are different integers; and
R=—(CH$_2$)$_n$CH$_3$ and R'=—(CH$_2$)$_m$COO$^-$Li$^+$, wherein 12<n<16, 1<m<10, and n and m are different integers.

6. A method in accordance with claim 5 wherein the pressure applied is greater than or equal to about 5 psi and the cooling rate is less than or equal to about 0.5° C./hour.

7. A method for preparing thin large-area single crystals of polydiacetylene comprising:
forming a liquid layer containing molten pure diacetylene monomer represented by the formula

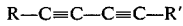

wherein R and R' are side groups selected such that the diacetylene monomer is polymerizable by a 1,4-addition solid state reaction upon exposure to actinic radiation between two clean, parallel, flat, smooth, opposed surface;
applying pressure of at least 0.5 psi (0.04 kg.cm$^{-2}$) to the liquid layer disposed between the two opposed surfaces; and
crystallizing the liquid layer disposed between the two opposed surfaces, while the liquid layer is kept under constant pressure of at least 0.5 psi, to a form a thin large-area single crystal of diacetylene monomer; and
exposing the thin large-area single crystal of diacetylene monomer to ultraviolet or gamma radiation to form a thin large-area single crystal of polydiacetylene;
wherein the steps of forming, applying pressure to, and crystallizing the liquid layer and exposing the monomer to radiation are all carried out in an inert atmosphere.

8. A method in accordance with claim 7 wherein R and R' are selected from the group of R and R' pairs consisting of
R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'=—(CH$_2$)$_4$OCONHC$_6$H$_5$;
R=—(CH$_2$)$_4$OCONHC$_2$H$_5$ and R'=—(CH$_2$)$_4$OCONHC$_2$H$_5$;
R=—(CH$_2$)$_4$OCONHCH(CH$_3$)$_2$ and R'=—(CH$_2$)$_4$OCONHCH(CH$_3$)$_2$;
R=—(CH$_2$)$_n$OCONHCH$_2$COOZ and R'=—(CH$_2$)$_n$OCONHCH$_2$COOZ, wherein Z is an alkyl or aryl group;
R=—CH$_2$NC$_{12}$H$_8$ and R'=—CH$_2$NC$_{12}$H$_8$;
R=—(CH$_2$)$_2$OH and R'=—(CH$_2$)$_2$OH;
R=—(CH$_2$)$_3$OH and R'=—(CH$_2$)$_3$OH;
R=—(CH$_2$)$_8$COOCH$_3$ and R'=—(CH$_2$)$_8$COOCH$_3$;
R=—CH$_2$OH and R'=—CH$_3$;
R=—(CH$_2$)$_n$CH$_3$ and R'=—(CH$_2$)$_m$COOH, wherein 12<n<16, 1<m<10, and n and m are different integers; and
R=—(CH$_2$)$_n$CH$_3$ and R'=—(CH$_2$)$_m$COO$^-$Li$^+$, wherein 12<n<16, 1<m<10, and n and m are different integers.

9. A method for preparing thin large-area single crystals of polydiacetylene comprising:
forming a liquid layer containing pure diacetylene monomer represented by the formula:

R—C≡C—C≡C—R' wherein R and R' are selected from the group R and R' pairs consisting of
R=—CH$_2$OSO$_2$C$_6$H$_4$CH$_3$ and R'=—CH$_2$OSO$_2$C$_6$H$_4$CH$_3$;
R=—CH$_2$OCONHC$_6$H$_5$ and R'=—CH$_2$OCONHC$_6$H$_5$;
R=—(CH$_2$)$_3$OCONHC$_6$H$_5$ and R'=—(CH$_2$)$_3$OCONHC$_6$H$_5$;
R=—(CH$_2$)$_4$OCONHC$_6$H$_5$ and R'=—(CH$_2$)$_4$OCONHC$_6$H$_5$;
R=—(CH$_2$)$_4$OCONHC$_2$H$_5$ and R'=—(CH$_2$)$_4$OCONHC$_2$H$_5$;
R=—(CH$_2$)$_4$OCONHCH(CH$_3$)$_2$ and R'=—(CH$_2$)$_4$OCONHCH(CH$_3$)$_2$;
R=—(CH$_2$)$_n$OCONHCH$_2$COOZ and R'=—(CH$_2$)$_n$OCONHCH$_2$COOZ, wherein Z in an alkyl or aryl group;
R=—CH$_2$NC$_{12}$H$_8$ and R'=—CH$_2$NC$_{12}$H$_8$;
R=—(CH$_2$)$_2$OH and R'=—(CH$_2$)$_2$OH;
R=—(CH$_2$)$_3$OH and R'=—(CH$_2$)$_3$OH;
R=—(CH$_2$)$_8$COOCH$_3$ and R'=—(CH$_2$)$_8$COOCH$_3$;
R=—CH$_2$OH and R'=—CH$_3$;
R=—(CH$_2$)$_n$CH$_3$ and R'=—(CH$_2$)$_m$COOH, wherein 12<n<16, 1<m<10, and n and m are different integers; and
R=—(CH$_2$)$_n$CH$_3$ and R'=—(CH$_2$)$_m$COO$^-$Li$^+$, wherein 12<n<16, 1<m<10, and n and m are different integers;
between two clean, parallel, flat, smooth, opposed surfaces by melting the pure diacetylene monomer between the two opposed surfaces to form a molten diacetylene monomer layer between the two opposed surfaces;
applying pressure greater than or equal to approximately 0.5 psi to the liquid layer disposed between the two opposed surfaces; and
crystallizing the liquid layer disposed between the two opposed surfaces, while the liquid layer is kept under constant pressure of at least 0.5 psi, by cooling the molten diacetylene monomer layer at a cooling rate less than or equal to about 0.1° C./minute to form a thin large-area single crystal of diacetylene monmer; and
exposing the thin large-area single crystal of diacetylene monomer to actinic radiation to form a thin large-area single crystal of polydiacetylene;
wherein the steps of forming, applying pressure to, and crystallizing the liquid layer and exposing the monomer to radiation are all carried out in an inert atmosphere.

10. A method for preparing thin large-area single crystals of polydiacetylene comprising:
forming a liquid layer containing pure diacetylene monomer represented by the formula

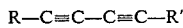

wherein R and R' are side groups selected such that the diacetylene monomer is polymerizable by a 1,4-addition solid state reaction upon exposure to actinic radiation between two clean, parallel, flat, smooth, opposed surfaces by melting the pure diacetylene monomer between the two opposed surfaces to form a molten diacetylene monomer layer;

applying pressure greater than or equal to about 0.5 psi to the liquid layer disposed between the two opposed surfaces;

crystallizing the liquid layer disposed between the two opposed surface, while the liquid layer is kept under constant pressure of at least 0.5 psi, by cooling the molten diacetylene monomer layer at a cooling rate less than or equal to about 0.1° C./minute to form thin large-area single crystal of diacetylene monomer; and exposing the thin large-area single crystal of diacetylene monomer to ultraviolet or gamma radiation to form a thin large-area single crystal of polydiacetylene;

wherein the steps of forming, applying pressure to, and crystallizing the liquid layer and exposing the monomer to radiation are all carried out in an inert atmosphere.

11. A method for preparing thin large-area single crystals of polydiacetylene in accordance with claim 10 wherein R and R' are selected from the group of R and R' pairs consisting of:

$R = CH_2OSO_2C_6H_4CH_3$ and $R' = -CH_2OSO_2C_6H_4CH_3$;

$R = -CH_2OCONHC_6H_5$ and $R' = -CH_2OCONHC_6H_5$;

$R = -(CH_2)_3OCONHC_6H_5$ and $R' = -(CH_2)_3OCONHC_6H_5$;

$R = -(CH_2)_4OCONHC_6H_5$ and $R' = -(CH_2)_4OCONHC_6H_5$;

$R = -(CH_2)_4OCONHC_2H_5$ and $R' = -(CH_2)_4OCONHC_2H_5$;

$R = -(CH_2)_4OCONHCH(CH_3)_2$ $R' = -(CH_2)_4OCONHCH(CH_3)_2$;

$R = -(CH_2)_nOCONHCH_2COOZ$ and $R' = -(CH_2)_nOCONHCH_2COOZ$, wherein Z is an alkyl or aryl group;

$R = -CH_2NC_{12}H_8$ and $R' = -CH_2NC_{12}H_8$;

$R = -(CH_2)_2OH$ and $R' = -(CH_2)_2OH$;

$R = -(CH_2)_3OH$ and $R' = -(CH_2)_3OH$;

$R = -(CH_8)COOCH_3$ and $R' = -(CH_2)_8COOCH_3$;

$R = -CH_2OH$ and $R' = -CH_3$;

$R = -(CH_2)_nCH_3$ and $R' = -(CH_2)_mCOOH$, wherein $12 < n < 16$, $1 < m < 10$, and n and m are different integers; and $R = -(CH_2)_nCH_3$ and $R' = -(CH_2)_mCOO^-Li^+$, wherein $12 < n < 16$, $1 < m < 10$, and n and m are different integers.

12. A method in accordance with claim 11 wherein the pressure applied is greater than or equal to about 5 psi and the cooling rate is less than or equal to about 0.5° C./hour.

* * * * *